(12) United States Patent
Park et al.

(10) Patent No.: US 9,276,212 B2
(45) Date of Patent: Mar. 1, 2016

(54) METHOD OF CUTTING FLEXIBLE DISPLAY DEVICE AND METHOD OF FABRICATING FLEXIBLE DISPLAY DEVICE USING THE SAME

(71) Applicant: LG Display Co., Ltd., Seoul (KR)

(72) Inventors: Namkil Park, Paju-si (KR); ChungWan Oh, Osan-si (KR); MinGyu Kim, Pohang-si (KR)

(73) Assignee: LG Display Co., Ltd., Seoul (KR)

( * ) Notice: Subject to any disclaimer, the term of this patent is extended or adjusted under 35 U.S.C. 154(b) by 15 days.

(21) Appl. No.: 14/077,884

(22) Filed: Nov. 12, 2013

(65) Prior Publication Data

US 2014/0134763 A1    May 15, 2014

(30) Foreign Application Priority Data

Nov. 14, 2012  (KR) .......................... 10-2012-0129084

(51) Int. Cl.
*H01L 51/00*    (2006.01)

(52) U.S. Cl.
CPC ....... *H01L 51/0014* (2013.01); *H01L 2251/566* (2013.01)

(58) Field of Classification Search
None
See application file for complete search history.

(56) References Cited

U.S. PATENT DOCUMENTS

| | | | |
|---|---|---|---|
| 6,236,446 B1 | 5/2001 | Izumi et al. | |
| 7,452,786 B2* | 11/2008 | Dozen et al. | 438/458 |
| 7,820,529 B2* | 10/2010 | Tsurume et al. | 438/464 |
| 8,715,802 B2* | 5/2014 | Tsai et al. | 428/41.8 |
| 2007/0161159 A1* | 7/2007 | Yamazaki et al. | 438/149 |
| 2008/0213984 A1* | 9/2008 | Moriwaka | 438/487 |
| 2009/0029527 A1* | 1/2009 | Amundson et al. | 438/464 |
| 2009/0134786 A1* | 5/2009 | Matsuzaki | H01L 51/5237 313/504 |
| 2011/0109829 A1* | 5/2011 | Mathew et al. | 349/58 |
| 2011/0207328 A1* | 8/2011 | Speakman | 438/694 |
| 2011/0223697 A1* | 9/2011 | Yong-Hwan et al. | 438/28 |
| 2011/0279417 A1* | 11/2011 | Kang et al. | 345/204 |
| 2013/0005059 A1* | 1/2013 | Song et al. | 438/28 |
| 2013/0249877 A1* | 9/2013 | Choi et al. | 345/205 |
| 2014/0339527 A1* | 11/2014 | Lee et al. | 257/40 |
| 2015/0048329 A1* | 2/2015 | Kim | 257/40 |

FOREIGN PATENT DOCUMENTS

| | | |
|---|---|---|
| CN | 1271646 A | 11/2000 |
| CN | 101505908 A | 8/2009 |
| CN | 101669224 A | 3/2010 |
| CN | 102043300 A | 5/2011 |
| DE | 197 15 537 A1 | 10/1997 |

OTHER PUBLICATIONS

State Intellectual Property Office of the People's Republic of China, First Office Action, Chinese Patent Application No. 201310566064.3, Aug. 21, 2015, twenty-one pages.

* cited by examiner

*Primary Examiner* — Evren Seven
(74) *Attorney, Agent, or Firm* — Fenwick & West LLP

(57) ABSTRACT

The present disclosure relates to a method of cutting a flexible display device, capable of preventing a generation of a defect at the time of cutting the flexible display device, the method including providing a glass mother substrate having a flexible substrate attached thereon and an insulating layer formed on the flexible substrate; melting the flexible substrate and the insulating layer on the mother substrate by irradiating with a first laser beam; and cutting the mother substrate exposed by the irradiation of the first laser beam using a cutting device.

12 Claims, 15 Drawing Sheets

METHOD OF CUTTING FLEXIBLE DISPLAY DEVICE AND METHOD OF FABRICATING FLEXIBLE DISPLAY DEVICE USING THE SAME

CROSS-REFERENCE To RELATED APPLICATIONS

Pursuant to 35 U.S.C. §119(a), this application claims the benefit of earlier filing date and right of priority to Korean Application No. 10-2012-0129084, filed on Nov. 14, 2012, the contents of which is incorporated by reference herein in its entirety.

FIELD OF THE DISCLOSURE

This specification relates to a method of cutting a flexible display device and a method of fabricating a flexible display device using the same, and particularly, to a method of cutting a flexible display device, capable of preventing the generation of defects, such as cracks, by cutting the flexible display device using a laser, and a method of fabricating a flexible display device using the cutting method.

BACKGROUND OF THE DISCLOSURE

In recent time, various types of flat panel display devices capable of reducing weights and volumes, which are disadvantages of a cathode ray tube, are being developed. Examples of the flat panel display device include a liquid crystal display (LCD) device, a field emission display device, a plasma display panel, an organic light emitting display device, and the like.

Among those flat panel display devices, the plasma display device is focused on as a display device, which is light, thin, short and small and the most advantageous for providing a large-scaled screen, by virtue of simplified structure and fabricating processes. However, the plasma display device also has disadvantages in view of low luminous efficiency and brightness and high power consumption. On the other hand, the LCD device has disadvantages in view of being difficult to implement a large screen due to the use of a semiconductor process and causing high power consumption due to a backlight unit. Also, the LCD device exhibits a great optical loss and a narrow viewing angle due to optical elements, such as a polarizing filter, a prism sheet, a diffusion plate and the like.

On the contrary, light emitting display devices are classified into an inorganic light emitting display device and an organic light emitting display device according to a material of a light emitting layer. The organic light emitting display device is a self-light emitting device, which has great advantages in the aspects of fast response speed, high luminous efficiency, high brightness, and a large viewing angle. The inorganic light emitting display device causes high power consumption and is unable to obtain high brightness, as compared with the organic light emitting display device. Also, the inorganic light emitting display device cannot emit light with various colors of red (R), green (G) and blue (B). On the other hand, the organic light emitting display device is actively being studied by virtue of several advantages, such as being able to be driven by a low DC voltage, which is several tens of volts, having a fast response speed, providing high brightness, and emitting various colors of R, G and B.

Meanwhile, a flexible display device using a flexible substrate, such as a plastic substrate, has been proposed for portability and convenience in use. The flexible display device may be fabricated in such a manner of attaching a plastic substrate, such as polyimide, onto a mother substrate made of glass, forming a plurality of display panels on the mother substrate through various processes, such as a thin film transistor (TFT) process, and cutting the mother substrate into display panel units.

Typically, for a general display device, namely, for an unbendable hard display device, various components, such as a TFT, lines, and the like, are formed directly on the glass mother substrate. Hence, the mother substrate has been divided into the display panel units in such a manner of forming cutting lines, as perpendicular cracks on the mother substrate using a cutting wheel, and applying pressure onto the cutting lines to propagate the perpendicular cracks from an upper surface to a lower surface of the mother substrate.

However, the flexible display device is fabricated by attaching the plastic substrate, such as polyimide, onto the mother substrate. Accordingly, when the mother substrate is cut using the cutting wheel, the plastic substrate and the glass substrate should be cut at once. However, the plastic substrate is not easily cut by the cutting wheel due to its low hardness compared to the glass substrate. In addition, unlike cutting the general display device, for cutting the flexible display device, an increase in a thickness of an object which is to be cut may be caused due to the plastic substrate. Consequently, the perpendicular crack generated by the cutting wheel may not be completely generated on the glass substrate. This may result in the generation of a defect on a cut surface upon cutting the mother substrate.

In addition, for an organic light emitting display (OLED) device, by introduction of impurities such as moisture or air, the OLED device may be defective and reduced in lifespan. Accordingly, various types of insulating layers are formed on an entire mother substrate for preventing the introduction of foreign materials or moisture. When the mother substrate is incompletely cut by the cutting wheel, a crack is propagated along the insulating layers through the cut surface. The propagated crack serves as a path through which the foreign materials or moisture are introduced into the OLED device, thereby causing a fabrication of a defective OLED device and a reduction of a lifespan of the OLED device.

SUMMARY OF THE DISCLOSURE

Therefore, to obviate the drawbacks of the related art, an aspect of the detailed description is to provide a method of cutting a display device, capable of preventing the generation of a defect by cutting the display device through a two-stage cutting process.

Another aspect of the detailed description is to provide a method of fabricating an organic light emitting display (OLED) device employing the display device cutting method.

To achieve these and other advantages and in accordance with the purpose of this specification, as embodied and broadly described herein, there is provided a method of cutting a flexible display device, the method including providing a glass mother substrate having a flexible substrate attached thereon and an insulating layer formed on the flexible substrate, melting the flexible substrate and the insulating layer on the mother substrate by irradiating a first laser beam, and cutting the mother substrate exposed by the irradiation of the first laser beam using a cutting device.

Here, the first laser may include an AN-YAG laser. The cutting device for cutting the mother substrate may be either a cutting wheel or a second laser. The second laser may be a CO2 laser, which may irradiate laser beams onto the mother substrate plural times to cut the mother substrate.

To achieve these and other advantages and in accordance with the purpose of this specification, as embodied and broadly described herein, there is provided a method of fabricating an organic light emitting display (OLED) device, the method including providing a mother substrate having a plurality of panel regions, attaching a flexible substrate onto each panel region of the mother substrate, the flexible substrate having a display part and an outer part at the outside of the display part, forming an organic light emitting structure on the display part of the flexible substrate, melting the flexible substrate between the adjacent panel regions of the mother substrate by irradiating a laser beam thereto, cutting the mother substrate exposed by the irradiation of the laser beam, and separating the mother substrate from the flexible substrate.

The present disclosure may allow materials with different properties to be cut off by two different cutting processes, thereby preventing the generation of a defective cut surface due to incomplete cutting. Specifically, after cutting a flexible substrate and insulating layers of an OLED device using a laser, a glass mother substrate may be cut using a laser or a cutting wheel, which may prevent a crack from being propagated into a display part through the insulating layers, due to the incomplete cutting. This may result in preventing a fabrication of a defective display device due to an introduction of foreign materials or moisture.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings:

FIGS. 3A to 3l are views illustrating a method of fabricating an organic light emitting display (OLED) device in accordance with the present disclosure;

DETAILED DESCRIPTION OF THE DISCLOSURE

Description will now be given in detail of the exemplary embodiments, with reference to the accompanying drawings.

The present disclosure may execute a two-stage cutting process for efficiently cutting a flexible display device, such as an organic light emitting display (OLED) device. That is, a plastic substrate or an insulating layer which is located on a glass substrate may first be cut, and in the next stage, the lower glass substrate is cut, so as to obtain a display device without a defective cut surface.

The two-stage cutting of the flexible display device is employed because a property of the lower glass substrate is different from that of the upper flexible plastic substrate. That is, since the lower glass substrate has a high hardness and the upper plastic substrate has a low hardness, one may be cut but the other may not when the both substrates are cut using the same cutting device.

Especially, according to the present disclosure, a mother substrate may be divided into a plurality of display panels by first cutting the plastic substrate using a laser and then cutting the glass substrate using a cutting wheel or the laser.

Figure 1A:
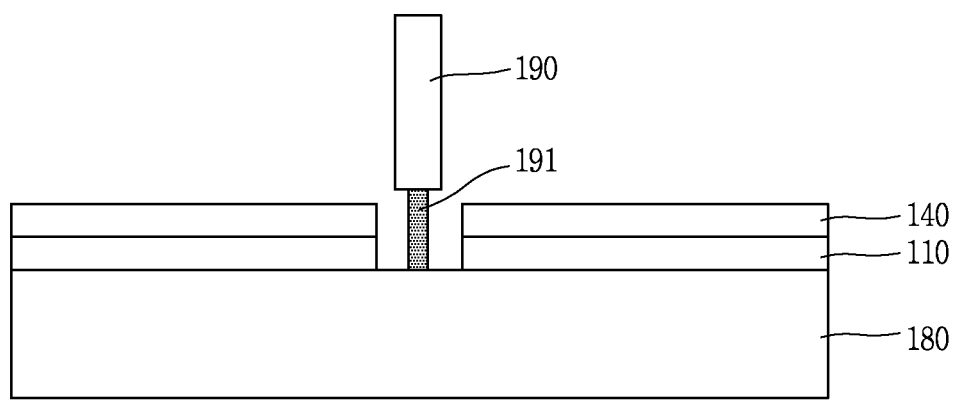
FIGS. 1A and 1B are views illustrating a method of cutting a flexible display device in accordance with a first exemplary embodiment of the present disclosure.
Figure 1B:
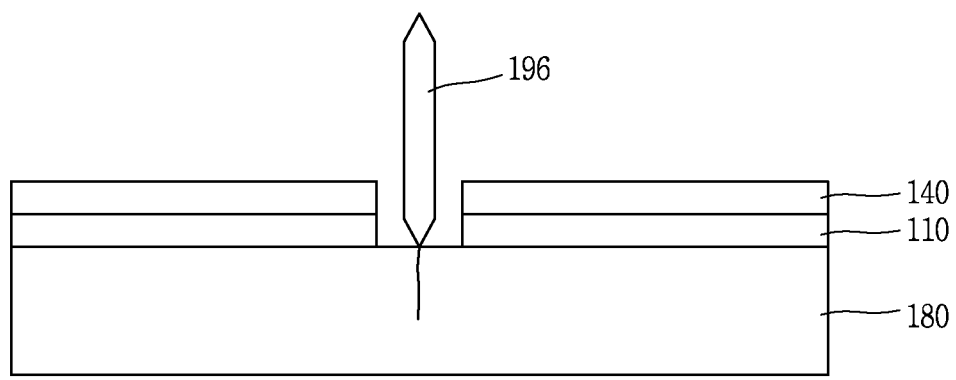

FIGS. 1A and 1B are views illustrating a method of cutting a flexible display device in accordance with a first exemplary embodiment of the present disclosure.

As illustrated in FIG. 1A, a flexible display device according to the present disclosure may include a mother substrate 180 made of a material with a high hardness, such as glass, a flexible substrate 110 formed on the mother substrate 180 and made of a plastic material such as polyimide, and various layers, such as an insulating layer 140, formed on the flexible substrate 110.

The flexible substrate 110 may be provided with the insulating layer 140 and various lines. The attachment of the flexible substrate 110 onto the mother substrate 180 may be carried out to keep the flexible substrate 110 flat while forming the various lines and insulating layers. That is, the flexible substrate 110 may be bendable by virtue of its flexibility. However, if the substrate 110 is bent during a process, it may be impossible to form a component of a desired shape. For this reason, the process may be carried out after attaching the flexible substrate 110 onto the mother substrate 180, which is made of hard, flat glass. After completion of the process, the flexible substrate 110 may be separated from the mother substrate 180, thereby completing the fabrication of the flexible display device.

Although not shown, on the mother substrate 180 may be provided a plurality of display panels. Hence, the mother substrate 180 may be individually cut into the plurality of display panels, and the cut mother substrate 180 may be separated from the cut flexible substrate 110, obtaining the flexible display device.

The cutting method according to the present disclosure may generally be employed to completely fabricate the individual flexible display devices by cutting the mother substrate with the plurality of display panels. However, the cutting method of the present disclosure may not be used only for separating the plurality of display panels, but also be used for cutting various portions, such as cutting off a useless portion of an outer part, even when fabricating one display device.

Referring to FIG. 1A, a laser 190 may be placed above the mother substrate 180 having the flexible substrate 110 and the insulating layer 140. The laser 190 may irradiate a laser beam 191 to cut the flexible substrate 110 and the insulating layer 140 formed on the mother substrate 180. Here, the laser 190 may be a solid laser such as an Nd-YAG laser. As the laser beam 191 is irradiated, the flexible substrate 110 and the insulating layer 140 may be melted. Here, on the mother substrate 180 may also be formed a protection film, such as a polystyrene (PS) film, a polyethylene (PE) film, a polyethylene naphthalate (PEN) film or a polyimide (PI) film or the like, instead of the insulating layer 140. Such protection film may also be melted by the Nd-YAG laser.

The laser 190 may scan the mother substrate 180 above the mother substrate 180 along a preset direction. Accordingly, the flexible substrate 110 and the insulating layer 140 may be melted, thereby externally exposing the mother substrate 180 by a preset width along the corresponding direction.

Afterwards, referring to FIG. 1B, a cutting wheel 196 may be laid on the exposed mother substrate 180. The cutting wheel 196 may be driven (moved) in a contact state with the mother substrate 180 to form a crack on the mother substrate 180. Here, the cutting wheel 196 may form a cutting line on the mother substrate 180 while moving along the exposed mother substrate 180, namely, along the scanned region by the laser 190.

Although not shown, when pressure is applied onto the mother substrate 180 with the cutting line formed thereon, the crack may be propagated down to a lower surface of the mother substrate 180, accordingly, the mother substrate 180 may be completely cut off.

As such, according to the first exemplary embodiment, after the plastic substrate 110 with the low hardness is cut by the laser 190, the glass substrate 180 with the high hardness may be cut by the cutting wheel 196. This may prevent a defective cut surface from being formed due to a difference in hardness between the plastic substrate 110 and the glass substrate 180.

Figure 2A:
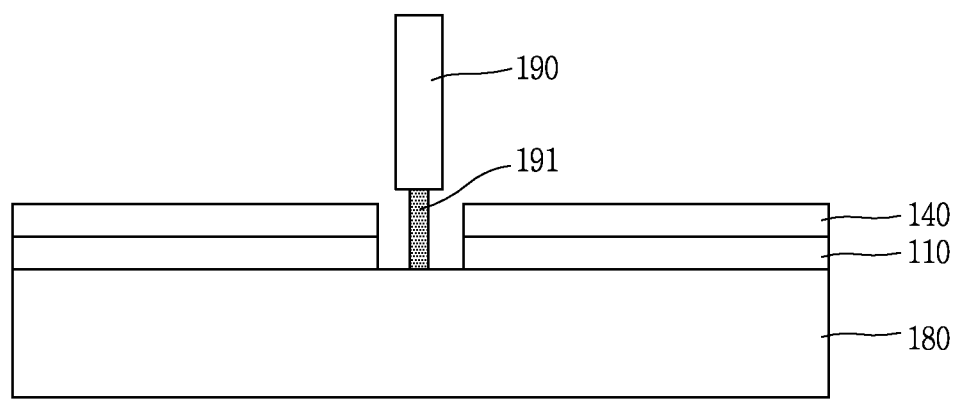
FIGS. 2A and 2B are views illustrating a method of cutting a flexible display device in accordance with a second exemplary embodiment of the present disclosure.
Figure 2B:
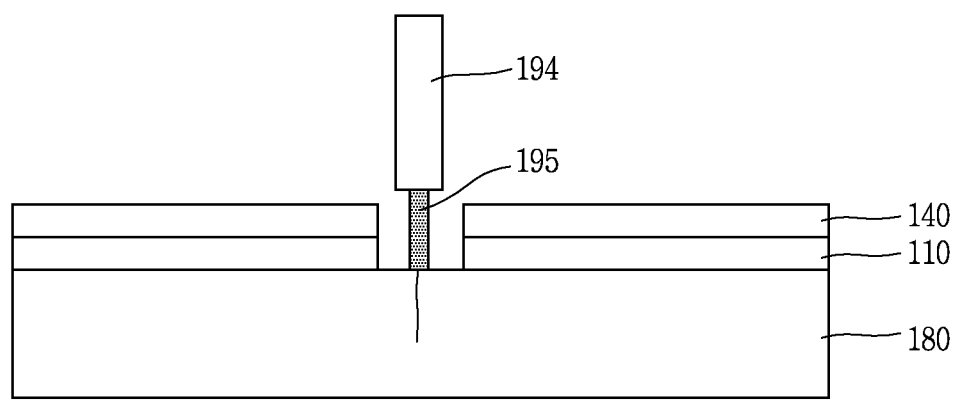

FIGS. 2A and 2B are views illustrating a method of cutting a flexible display device in accordance with a second exemplary embodiment of the present disclosure.

As illustrated in FIG. 2A, similar to the first exemplary embodiment, in this second exemplary embodiment, a first laser 190, such as an Nd-YAG laser, may be placed above a mother substrate 180 which includes a flexible substrate 110 made of a plastic material, and an insulating layer 140, such as a protection film, on the flexible substrate 110. A first laser beam 191 may then be irradiated onto the mother substrate 180. The irradiation of the first laser beam 191 may melt off the flexible substrate 110 and the insulating layer 140 on the mother substrate 180, thereby exposing the mother substrate 180 through a region on which the first laser beam 191 has been irradiated.

Afterwards, referring to FIG. 2B, after a second laser 194 is placed above the mother substrate 180, a second laser beam 195 may be irradiated onto the exposed region of the mother substrate 180. The irradiation of the second laser beam 195 may bring about the repetition of expansion and contraction of the glass substrate 180, thereby forming a crack on the mother substrate 180. Here, the second laser 194 may form a cutting line on the mother substrate 180 by scanning the mother substrate 180 while moving along the exposed mother substrate 180, namely, along the scanned region by the second laser 194. Here, the second laser 194 may form the crack by one-time irradiation or plural-time irradiation taking into account the hardness of the mother substrate 180 and the like.

Although not shown, when pressure is applied onto the mother substrate 180 with the cutting line formed thereon, the crack may be propagated down to a lower surface of the mother substrate 180, accordingly, the mother substrate 180 may be completely cut off.

The first laser 190 and the second laser 194 may melt materials with different properties, respectively. Therefore, the first and second lasers 190 and 194 may be implemented as lasers with different wavelengths and intensities from each other. In the present disclosure, a solid laser such as an AN-YAG laser may be employed as the first laser 190 and a gas laser such as a $CO_2$ laser may be employed as the second laser 194.

As such, according to the present disclosure, the flexible display device may be smoothly cut off by use of the different cutting devices for cutting the flexible substrate 110 and the insulating laser 140 and for cutting the rigid glass substrate 180, respectively. This may prevent the formation of a defective cut surface and also prevent the crack formed on the insulating laser 140 and the like from being propagated to the display device.

The cutting method according to the present disclosure may be applied to various types of flat display devices, such as an OLED device, a light emitting display (LED) device, a liquid crystal display (LCD) device, an electrophoretic display device, a plasma display device and the like. Hereinafter, description will be given of a method of fabricating a display device, to which a method of cutting, for example, an OLED device is applied.

FIGS. 3A to 3I are views illustrating a method of fabricating an organic light emitting display (OLED) device in accordance with the present disclosure.

Figure 3A:
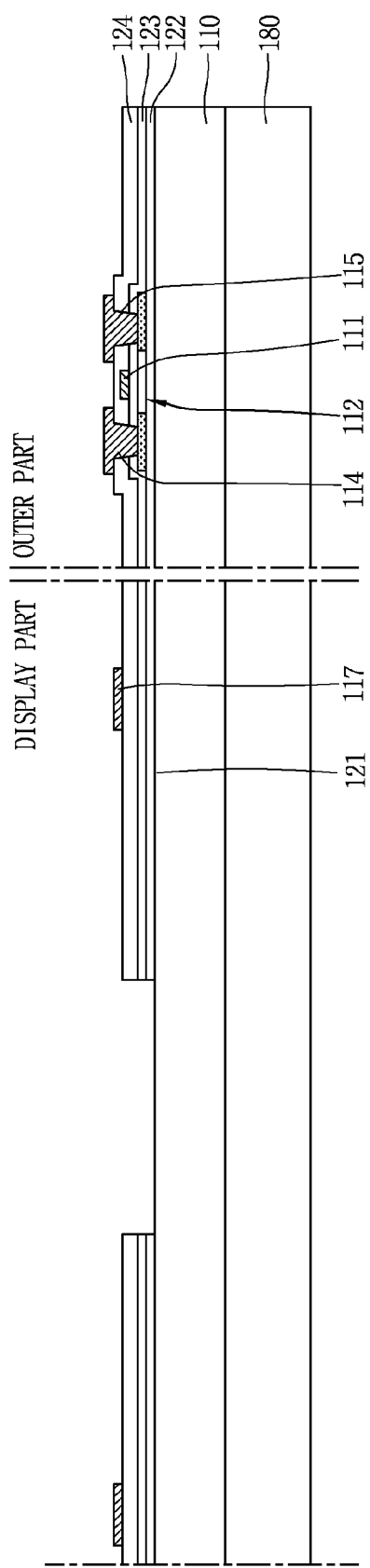

As illustrated in FIG. 3A, a substrate 110, which is made of a plastic material such as polyimide (PI), may be attached onto a mother substrate 180 made of glass by use of an adhesive or the like. Here, FIG. 3 illustrates two panel regions adjacent to each other, but the mother substrate 180 may include N×M (N,M≥2) panel regions. Hence, N×M substrates 110 may be attached with preset intervals. Or, the flexible substrate 110 which has substantially the same area as that of the mother substrate 180 may also be attached onto the mother substrate 180. In addition, each panel region includes a number of pixel regions, but the drawings merely illustrate an outermost region of a display part and an outer part for the sake of explanation.

Afterwards, a buffer layer 122 made of an inorganic material or the like may be formed on the flexible substrate 110. Here, the buffer layer 122 may be implemented as a single layer or as a multi-layer. A transparent oxide semiconductor such as indium gallium zinc oxide (IGZO) or crystalline silicon may be deposited on the entire substrate 110 by chemical vapor deposition (CVD), followed by etching, thereby forming a semiconductor layer 112 on the buffer layer 122. Here, a crystalline silicon layer may be formed by depositing the crystalline silicon, or by depositing amorphous silicon and then crystallizing the amorphous material by various crystallization methods, such as laser crystallization and the like. n+ or p+ type impurity may be doped on both side surfaces of the crystalline silicon layer to form doped layers.

Afterwards, an inorganic insulating material, such as $SiO_2$ or SiOx, may be deposited on the semiconductor layer 112 by the CVD so as to form a first insulating layer 123. A nontransparent metal with high conductivity, such as Cr, Mo Ta, Cu, Ti, Al or Al alloy, may be deposited on the first insulating layer 123 by a sputtering process, and etched by a photolithography process, forming a gate electrode 111 on each pixel region of the display part. An inorganic insulating material may then be deposited on the entire substrate 110 with the gate electrode 111 by the CVD, thereby forming a second insulating layer 124.

Here, the buffer layer 122, the first insulating layer 123 and the second insulating layer 124 may also be formed on the outer part. The drawings illustrate that the buffer layer 122, the first insulating layer 123 and the second insulating layer 124 are not formed between the adjacent display panels. However, the buffer layer 122, the first insulating layer 123 and the second insulating layer 124 may also be formed on the region between the display panels.

The first insulating layer 123 and the second insulating layer 124 may then be etched to form a contact hole through which the semiconductor layer 112 is exposed. Afterwards, a nontransparent metal with high conductivity, such as Cr, Mo Ta, Cu, Ti, Al or Al alloy, may be deposited on the entire substrate 110 by the sputtering process, followed by etching, thereby forming a source electrode 114 and a drain electrode 115, which are electrically connected to the semiconductor layer 112 through the contact hole, on the display part and a pad 117 on the outer part.

Figure 3B:
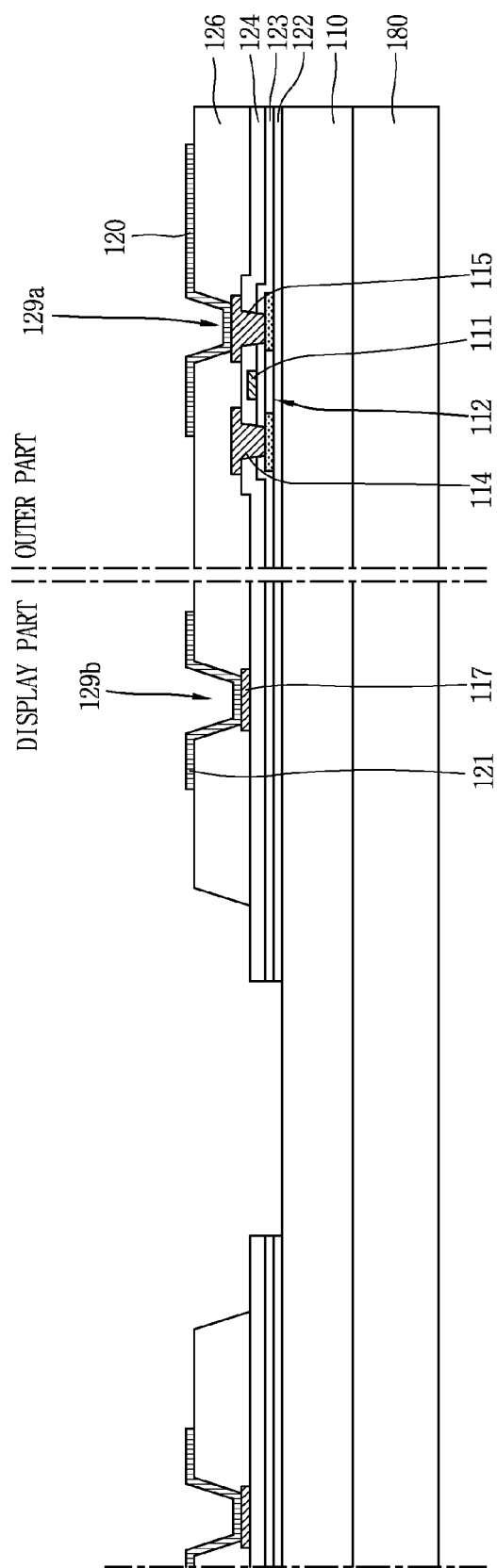

Referring to FIG. 3B, an inorganic insulating material may be deposited on the entire substrate 110 having the source electrode 114, the drain electrode 115 and the pad 117, forming a third insulating layer 126. A partial region of the third insulating layer 126 may be etched, thereby forming a first contact hole 129a and a second contact hole 129b on the display part and the outer part, respectively. Here, the third insulating layer 126 may be formed by depositing $SiO_2$. The drain electrode 115 of a TFT may be externally exposed through the first contact hole 129a, and the pad 117 may be externally exposed through the second contact hole 129b.

Also, the drawing illustrates that the third insulating layer 126 is not formed on an outermost region of the outer part, namely, a cut region which is adjacent to another OLED panel. However, the third insulating layer 126 may also be formed on the cut region.

Afterwards, a metal such as Ca, Ba, Mg, Al, and Ag may be deposited on the entire substrate 110, followed by etching, thereby forming a pixel electrode 120, which is connected to the drain electrode 115 of the driving TFT through the first contact hole 129a, on the display part and a metal layer 121 on the outer part.

Figure 3C:
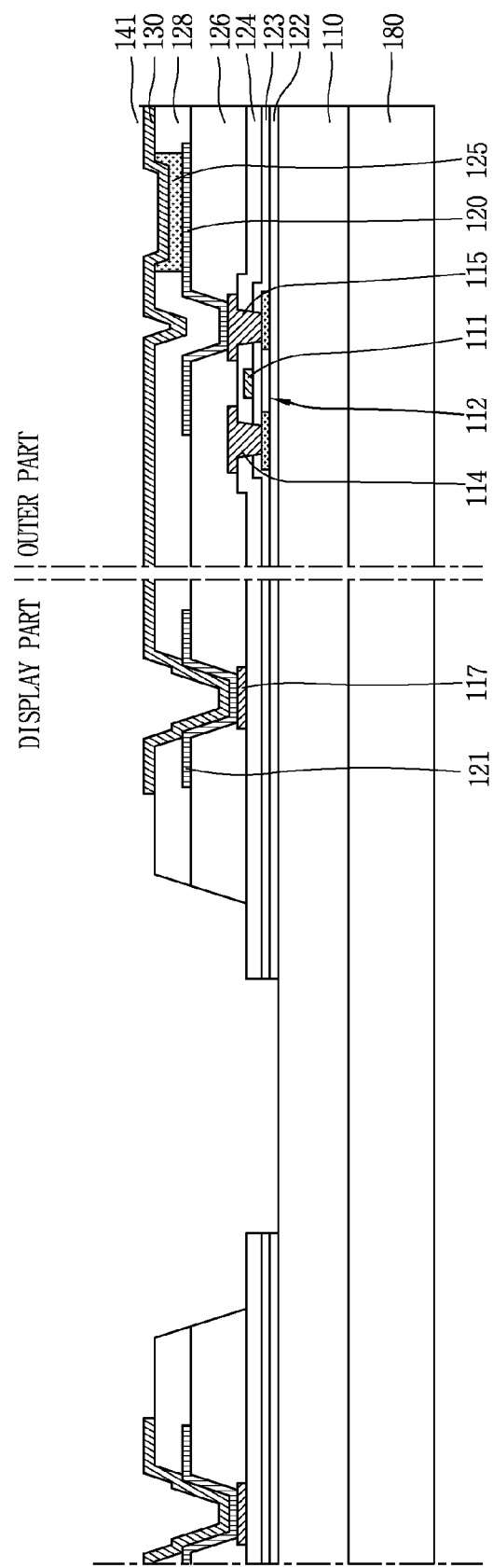

Referring to FIG. 3C, a bank layer 128 may be formed on the display part and the outer part. The bank layer 128 is a type of barrier wall, which partitions each pixel region to prevent light of specific colors, output from adjacent pixel regions, from being output in a mixed state. The bank layer 128 may also serve to reduce a stepped portion by filling a part of the first contact hole 129a, which may result in preventing a formation of a defective organic light emitting unit, which may be caused due to an excessive stepped portion formed upon forming the organic light emitting unit. The bank layer 128 may extend to the outer part. Here, a contact hole may be formed through the bank layer 128 located on the pad 117 of the outer part, such that the pad 117 can be externally exposed through the bank layer 128. Meanwhile, an outer end portion of the bank layer 128 may be located on almost the same line with an end portion of the third insulating layer 126. Accordingly, a stepped portion may not be formed between the third insulating layer 126 and the bank layer 128. Here, the bank layer 128 may be formed by depositing and etching an organic insulating material, or by depositing an inorganic insulating material by the CVD and then etching the inorganic insulating material.

Afterwards, an organic light emitting unit 125 may be formed on a region surrounded by the bank layer 128 located on the pixel electrode 120. The organic light emitting unit 125 may include an R-organic light emitting layer emitting red light, a G-organic light emitting layer emitting green light, and a B-organic light emitting layer emitting blue light. Although not shown, the organic light emitting unit 125 may also include, in addition to the organic light emitting layers, an electron injection layer and a hole injection layer formed on the organic light emitting layers for injecting electrons and holes into the organic light emitting layers, respectively, and an electron transport layer and a hole transport layer for transporting the injected electrons and holes to the organic light emitting layers, respectively.

Also, the organic light emitting layers may be implemented as a white organic light emitting layer for emitting white light. Here, R, G and B color filter layers may be formed below the white organic light emitting layer, for example, on R, G and B sub pixels regions on the insulating layer 124, respectively, to convert the white light emitted from the white organic light emitting layer into red light, green light and blue light. The white organic light emitting layer may be formed by mixing a plurality of organic materials which emit RGB monochromic light, respectively, or by depositing a plurality of light emitting layers which emit RGB monochromic light, respectively.

In the above description, the bank layer 128 is formed and the organic light emitting unit 125 is surrounded by the bank layer 128. However, the organic light emitting unit 125 may first be formed and then the bank layer 128 may be formed.

Figure 3D:
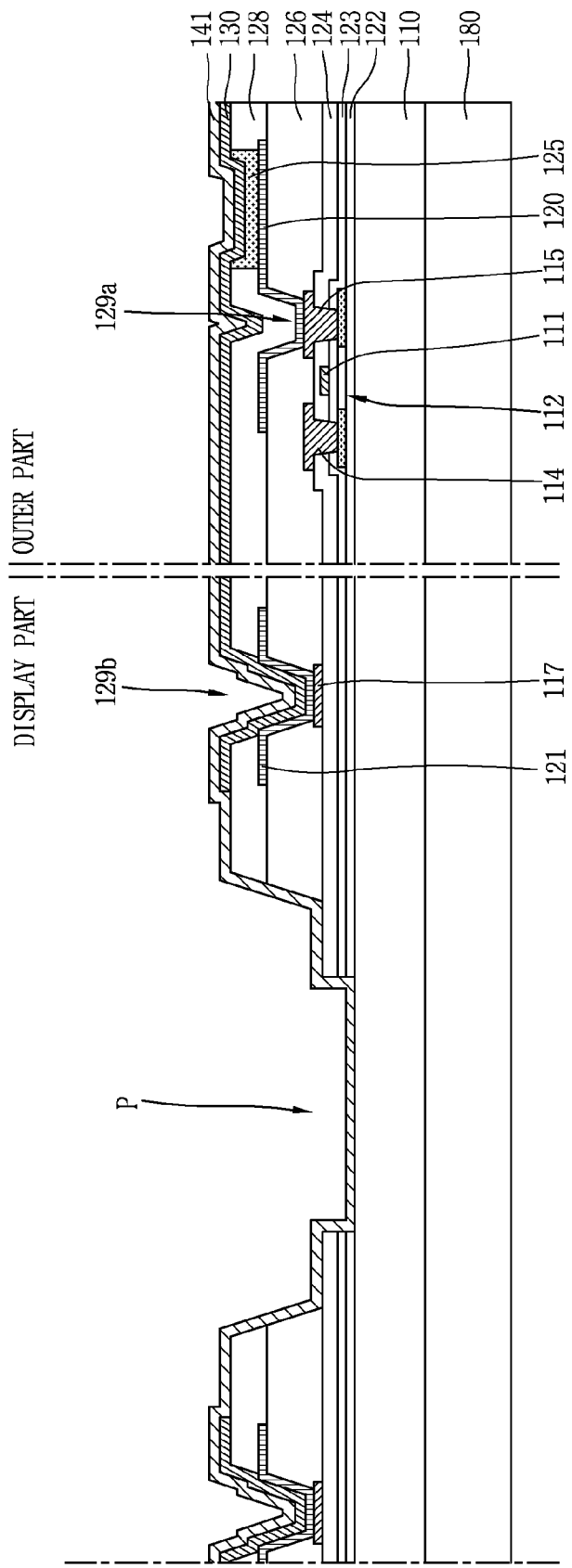

Then, referring to FIG. 3D, a transparent conductive material, such as ITO or IZO, may be deposited on the bank layer 128 and the organic light emitting unit 125 by sputtering, followed by etching, thereby forming a common electrode 130. Here, the common electrode 130 on the outer part may be connected to the pad 117 through the second contact hole 129b via the metal layer 130, to apply a signal to the common electrode 130 within the display part.

The common electrode 130 may be an anode of the organic light emitting unit 125 and the pixel electrode 120 may be a cathode of the organic light emitting unit 125. When a voltage is applied to the common electrode 130 and the pixel region 120, electrons may be injected from the pixel electrode 120 into the organic light emitting unit 125, and holes may be injected from the common electrode 130 into the organic light emitting unit 125. The electrons and the holes may then be excited in the organic light emitting layer so as to generate excitons. As the excitons decay, light corresponding to an energy difference between lowest unoccupied molecular orbital (LUMO) and highest occupied molecular orbital (HOMO) of the light emitting layer may be generated and emitted to the outside (toward an upper side of the common electrode 130 in the drawing).

A first passivation layer 141 may be formed by depositing an inorganic material on the common electrode 130 and the bank layer 128. Here, the first passivation layer 141 may also be formed on the insulating layers 122 and 123 of the outer part and on a cut region which is adjacent to another OLED panel.

Figure 3E:
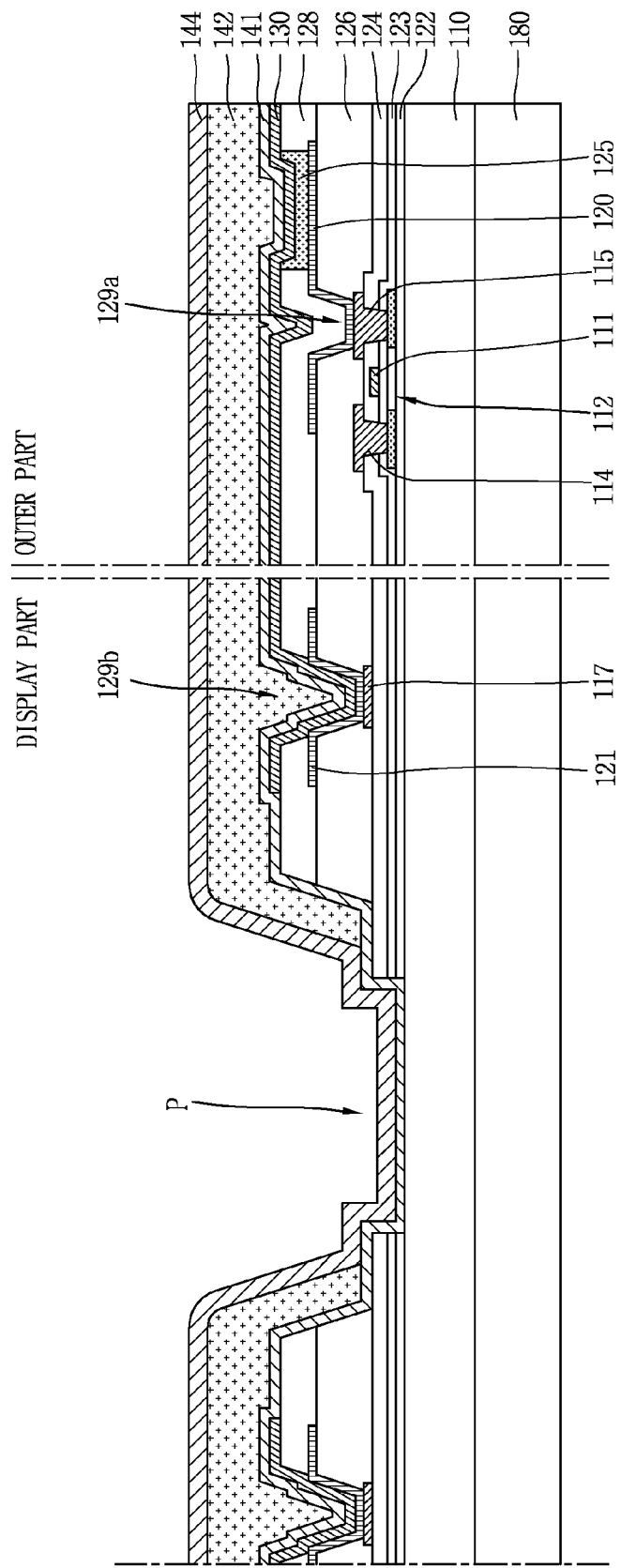

Afterwards, referring to FIG. 3E, an organic material such as polymer and the like may be deposited on the first passivation layer 141 so as to form an organic layer 142. Here, the organic layer 142 may be formed by print screening. That is, although not shown, after a screen is placed on the substrate 110 and polymer is deposited on the screen, pressure may be applied onto the polymer by a doctor blade or a roll, thereby forming the organic layer 142.

The organic layer 142 may be about 8 to 10 μm thick and extend up to a preset region of the outer part, so as to completely cover the bank layer 128. Or, the organic layer 142 may cover only a part of the bank layer 128 of the outer part or only up to an end portion of the bank layer 128.

Afterwards, an inorganic material such as $SiO_2$ or SiOx may be deposited on the organic layer 142, thereby forming a second passivation layer 144 on the organic layer 142. Here, the second passivation layer 144 may extend to the outer part.

Figure 3F:
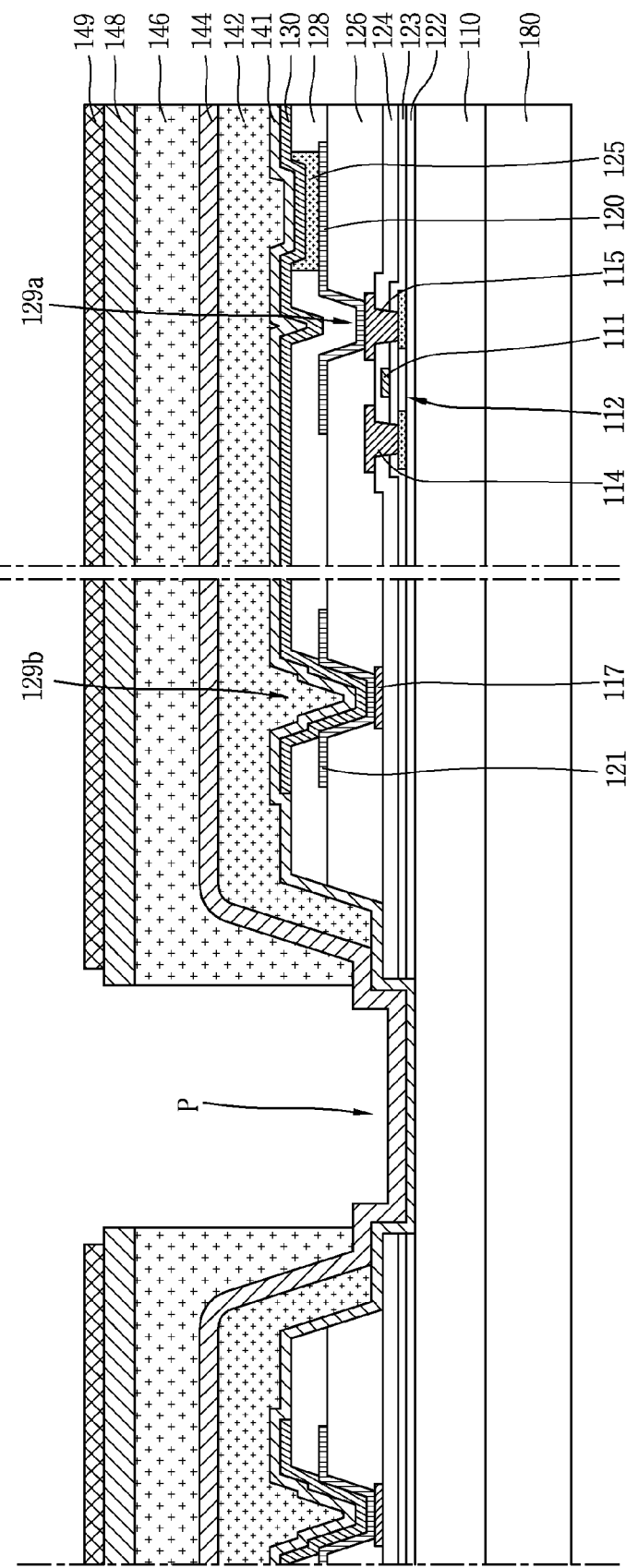

Referring to FIG. 3F, an adhesive may be deposited on the second passivation layer 144 to form an adhesive layer 146. On the adhesive layer 146 may be laid a protection film 148, such as a polystyrene (PS) film, a polyethylene (PE) film, a polyethylene naphthalate (PEN) film or a polyimide (PI) film or the like. Pressure may be applied to the protection film 148 to closely adhere the protection film 148 onto the second passivation layer 144. Here, thermosetting resin or photocurable resin may be used as the adhesive. For use of the thermosetting resin, heat may be applied after adhering the protection film 148. For use of the photocurable resin, the protection film 148 may be adhered and light may be irradiated to cure the adhesive layer 146.

Afterwards, a polarizing plate 149 may be attached onto the protection film 148, thereby fabricating N×M organic light emitting display (OLED) panels on the mother substrate 180. The polarizing plate 149 may improve quality of image by allowing light emitted from the organic light emitting display device to be transmitted therethrough and prevent external incident light from being reflected thereby.

Here, as illustrated in FIG. 3F, the flexible substrate 110, which is made of plastic, the first passivation layer 142 and the second passivation layer 144 may be formed on a boundary region between the adjacent OLED panels formed on the mother substrate 180. Although not shown, a buffer layer or an insulating layer may also be formed on the boundary region.

Figure 3G:
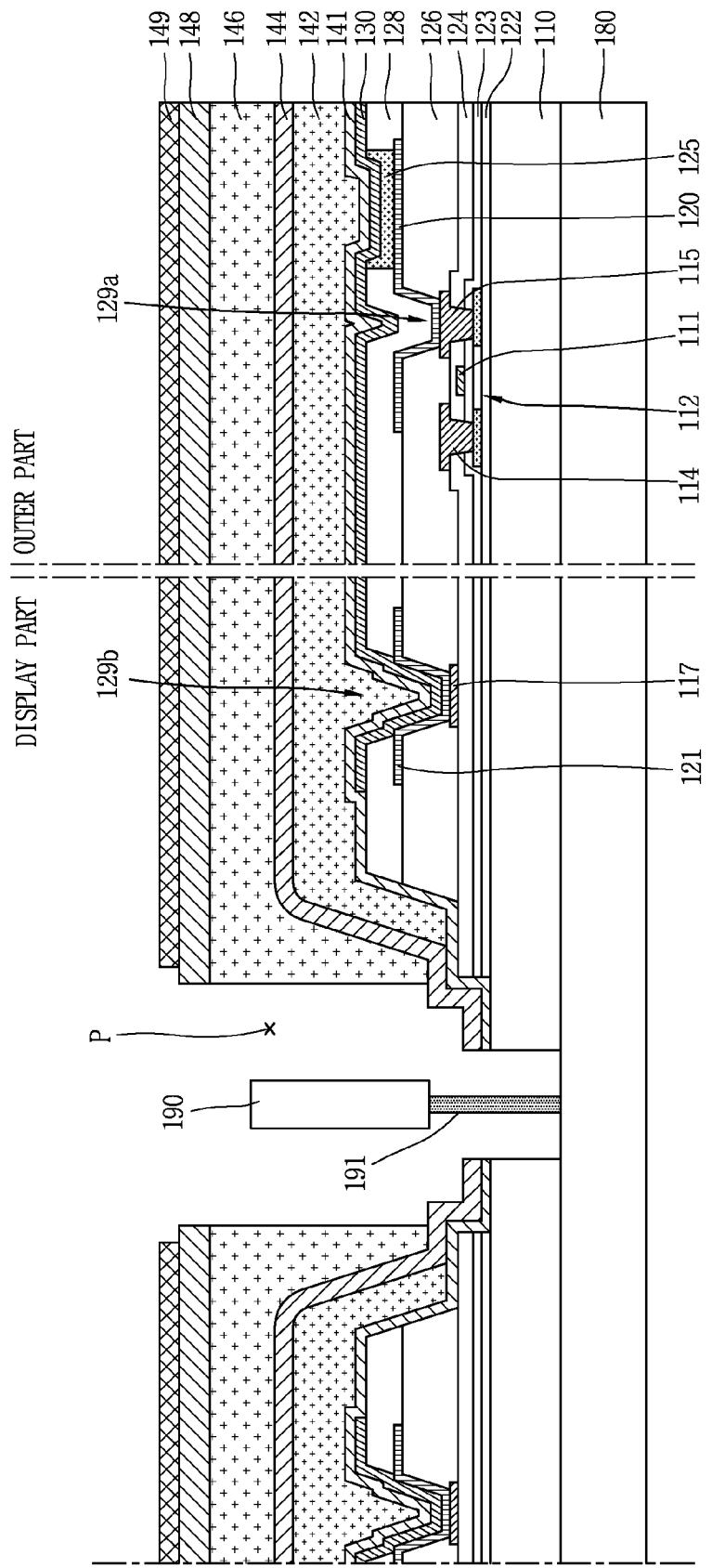

Referring to FIG. 3G, a solid laser 190 such as an AN-YAG laser may be placed above a cut region P between the adjacent panels, and irradiate a laser beam 191 onto the cut region P, thereby melting the flexible substrate 110 and the passivation layers 141 and 144.

The cutting process may be carried out in such a manner of scanning the cut region P with moving the laser 190 along one direction. The cutting process is illustrated in FIGS. 4A and 4B.

Figure 4A:
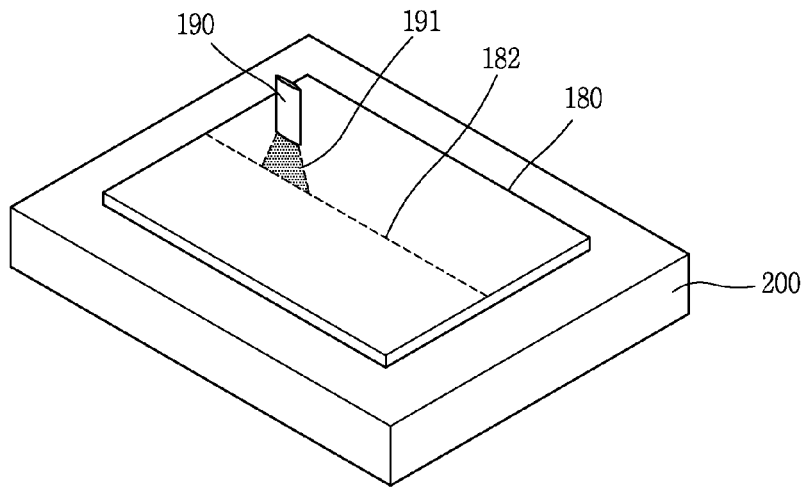
FIGS. 4A to 4C are views of cutting an OLED device in a unit of mother substrate by use of a laser and a cutting wheel.

Referring to FIG. 4A, when the mother substrate 180 is loaded on a table 200, the laser 190 may be placed above one end portion of the mother substrate 180, and irradiate the laser beam 191 onto the one end portion of the mother substrate 180, so as to melt the flexible substrate and the passivation layers on the mother substrate 180.

Figure 4B:
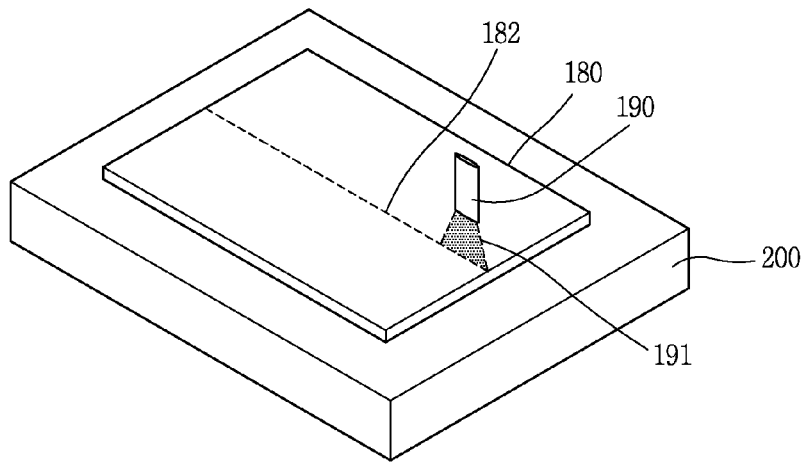

During the irradiation of the laser beam 191, when the laser beam 191 is irradiated along a cutting-expected line 182, which is formed from one end to the other end of the mother substrate 180, by moving the laser 190 or the table 200, as illustrated in FIG. 4B, the flexible substrate and the passivation layers on the mother substrate 180 may be melted, forming a region on which the mother substrate 180 is exposed.

Figure 3H:
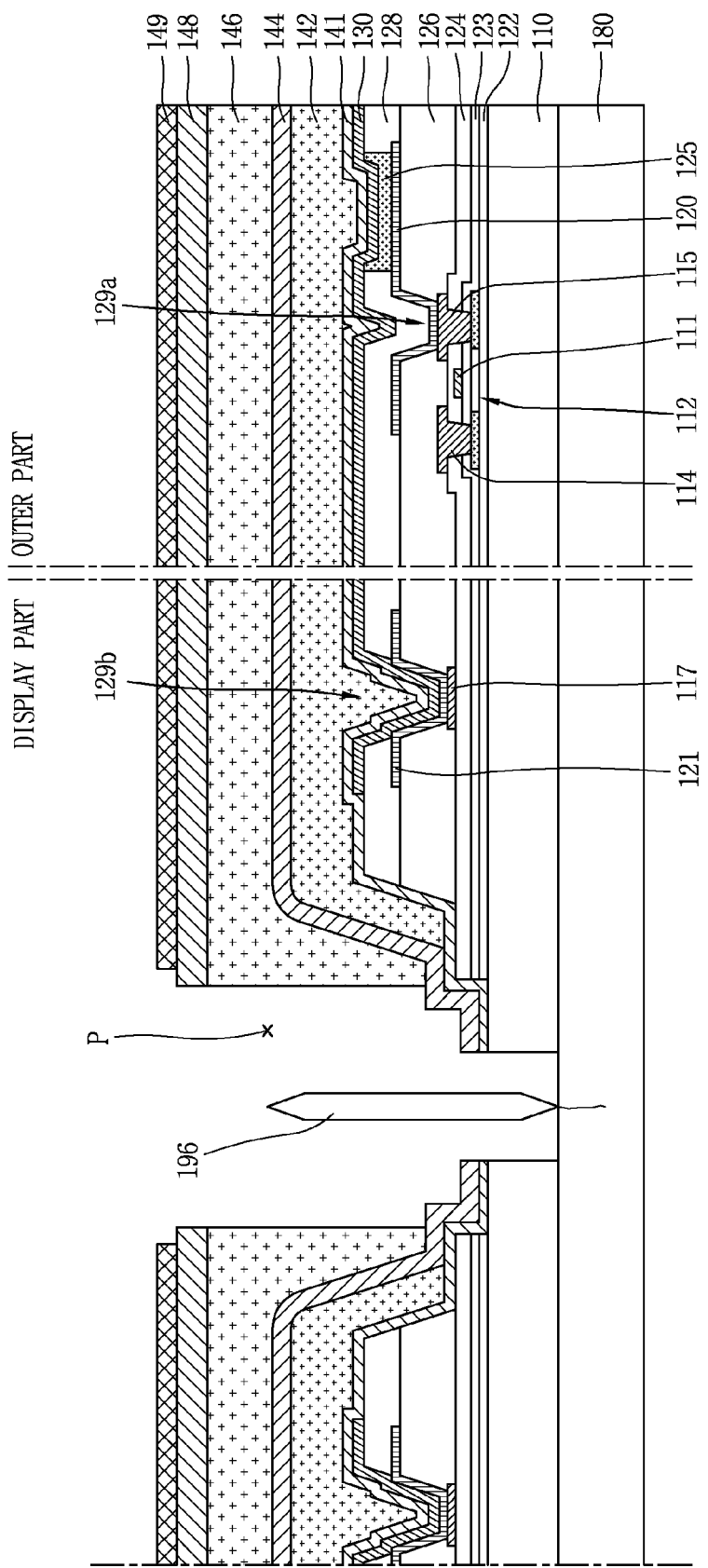

Afterwards, referring to FIG. 3H, after a cutting wheel 196 is disposed between the adjacent display panels on the mother substrate 180, exposed by the laser 190, the cutting wheel 196 may be driven (moved) to form a crack on the mother substrate 180.

Figure 4C:
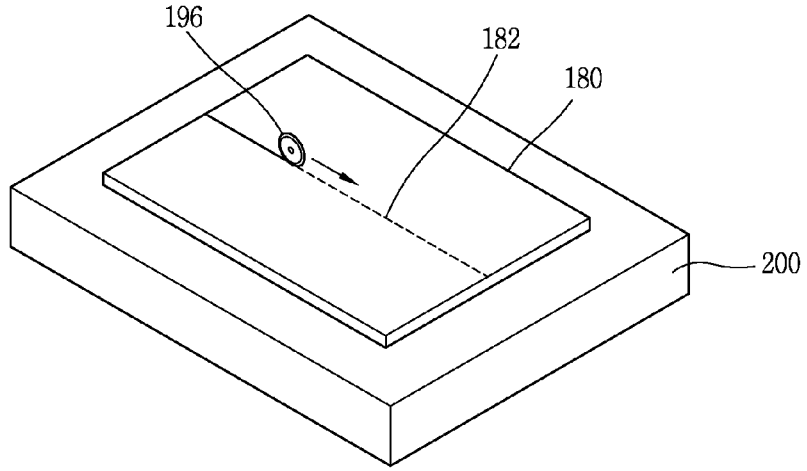

That is, referring to FIG. 4C, as the cutting wheel 196 is driven in a contact state with the one end portion of the mother substrate 180, a crack may be formed on the mother substrate 180. In this state, when the cutting wheel 196 is moved along the cutting-expected line 182 in a manner of moving the cutting wheel 196 or the table 200, a cut line as the crack may be formed on the mother substrate 180.

Afterwards, although not shown, when pressure is applied to the mother substrate 180 with the cut line formed thereon, the crack formed by the cutting wheel 196 along the cut line may be propagated to a lower surface of the mother substrate 180, thereby dividing the mother substrate 180 into a plurality of unit panels.

Figure 3I:
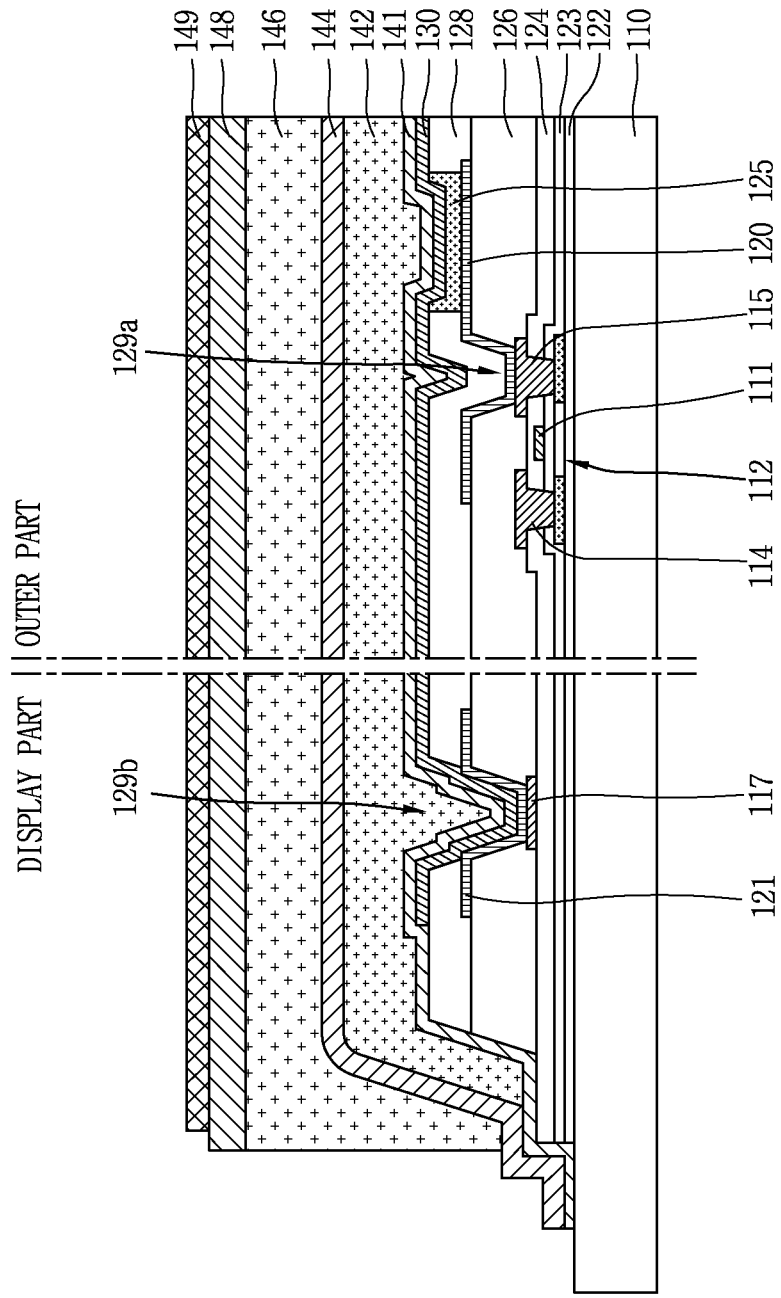

Referring to FIG. 3I, a laser beam may be irradiated onto each of the OLED panels, which have been cut off separately, from the side of the mother substrate 180 to apply heat onto the display panel, thereby separating the substrate 110 from the mother substrate 180. Accordingly, a flexible OLED device may be completely fabricated.

Meanwhile, the cutting of the mother substrate may not be achieved by the laser and the cutting wheel. The mother substrate may also be cut in such a manner of melting the flexible substrate and the insulating layer using a laser and then irradiating a laser beam using the laser again. A cutting method using two-stage laser irradiation is illustrated in FIGS. 5A and 5B.

First, the flexible substrate 110 may be attached onto the mother substrate 180. The processes illustrated in FIGS. 3A to 3F may be repetitively carried out to form a plurality of display panels, each of which includes the TFT, the insulating layers 122, 124 and 126, the pixel electrode 120, the common electrode 121, the organic layer 142, and the passivation layers 141 and 144, on the mother substrate 180 with the flexible substrate 110 attached thereon. Here, the flexible substrate 110 and the passivation layers 141 and 144 may also be formed between two adjacent panel regions.

Figure 5A:
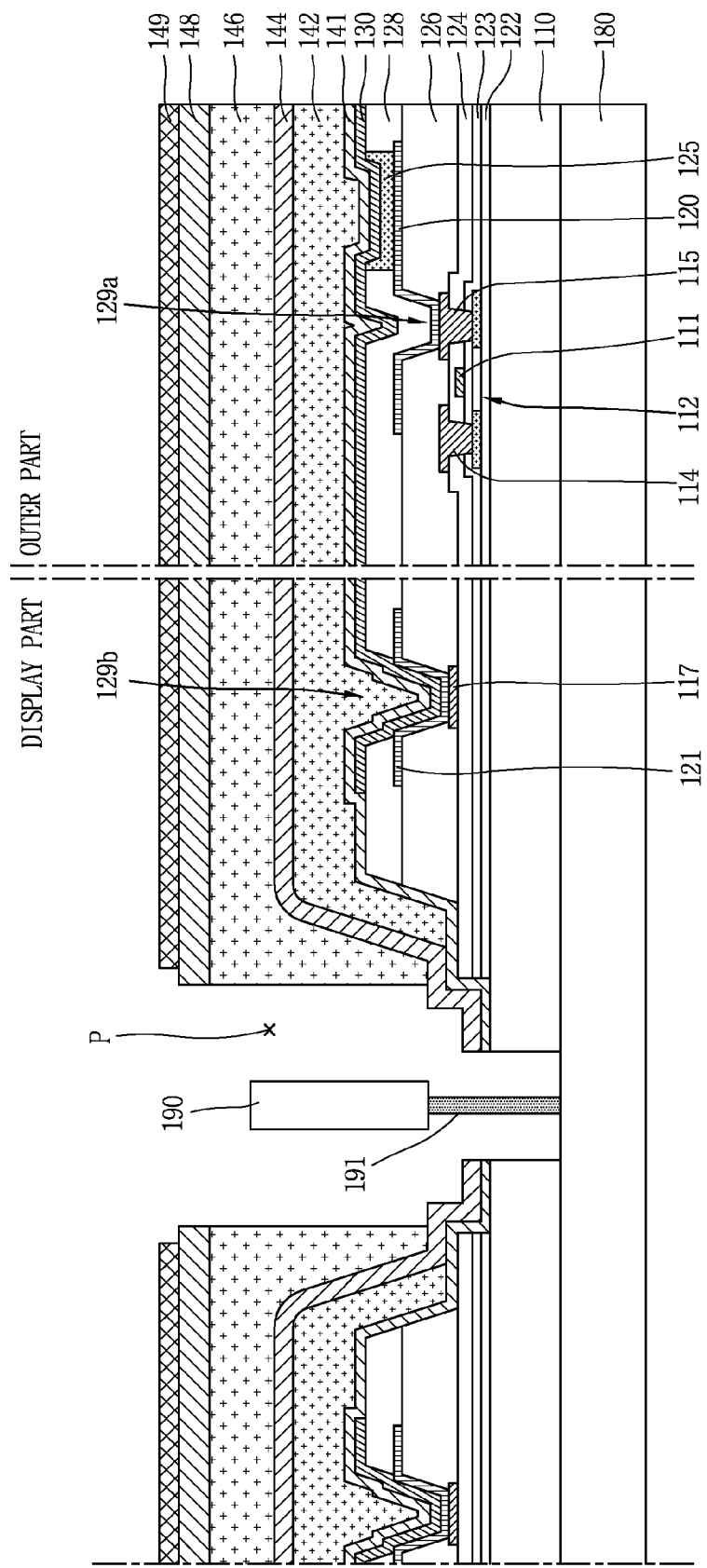
FIGS. 5A and 5B are views illustrating a method of fabricating an OLED device in accordance with another exemplary embodiment of the present disclosure.

Referring to FIG. 5A, after the first laser 190 is laid above the cut region P on the fabricated mother substrate 180, a first laser beam 191 may be irradiated onto the passivation layers 141 and 144 and the flexible substrate 110. Here, the first laser 190 may be a solid laser such as an AN-YAG laser. The first laser 190 may melt the passivation layers 141 and 144 and the flexible substrate 110 located on the laser-irradiated region, thereby externally exposing the lower mother substrate 180.

Figure 5B:
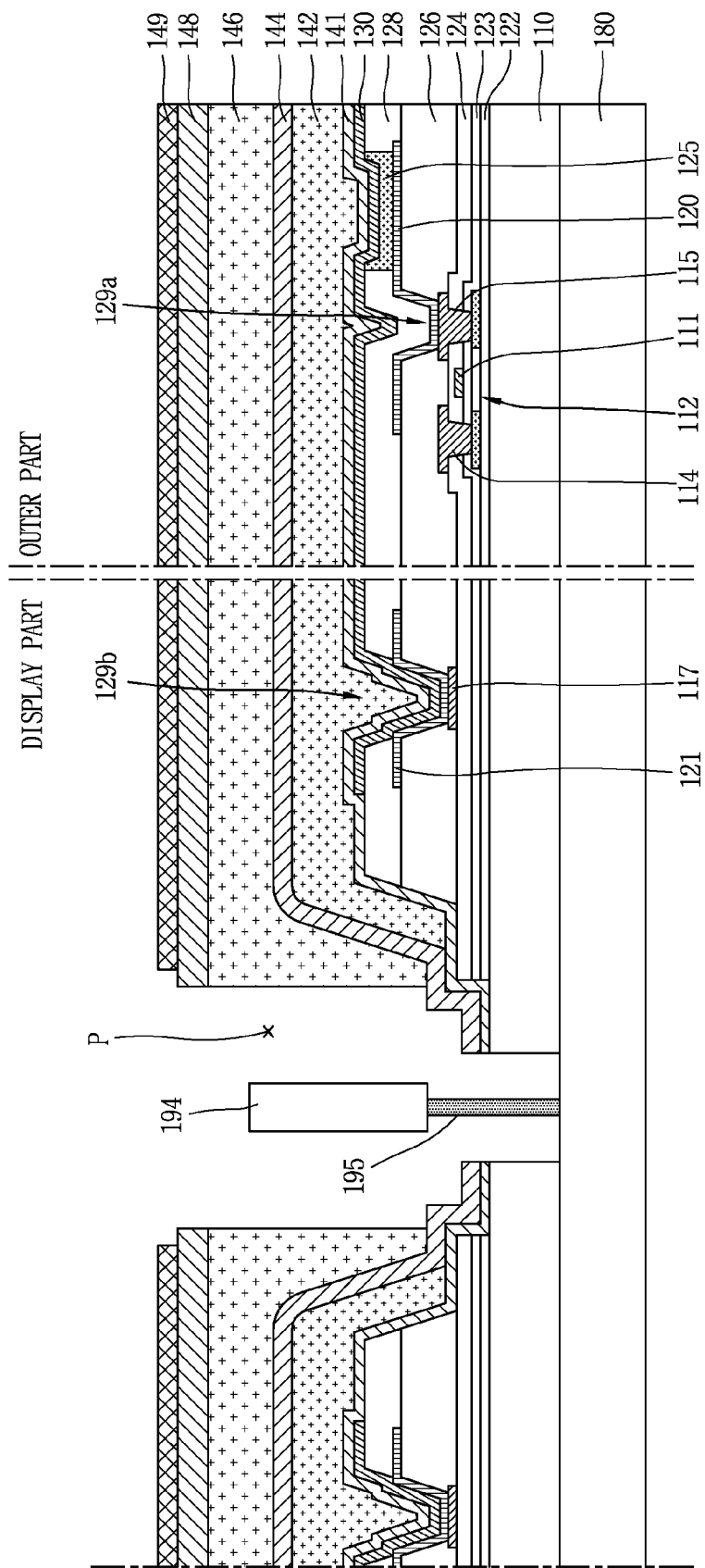

Afterwards, referring to FIG. 5B, after a second laser 194, such as a $CO_2$ laser, is placed above the exposed mother substrate 180, a second laser beam 195 may be irradiated. With the irradiation of the second laser beam 195, the mother substrate 180 made of glass may be thermally expanded and contracted, accordingly, a crack may be formed on the glass. Although not shown, for smooth thermal-expansion and contraction of the mother substrate 180, a cooling member, which sprays cold air onto the region where the second laser beam 195 is irradiated to cool the thermally-expanded region, may further be installed.

Also, the second laser beam 195 may be irradiated onto the mother substrate 180 only once or more than two times. That is, the first laser 190 may scan the mother substrate 180 one time, but the second laser 194 may scan the mother substrate 180 more than two times, if necessary, so as to cut off the glass substrate.

As such, the cutting of an OLED device using two lasers may bring about the following effects.

First, a mother substrate may be uniformly cut, so as to prevent a formation of a defective panel. Since a laser beam irradiated onto the substrate always has constant energy, uniform cutting of the substrate may be enabled so as to prevent a generation of a defect.

Second, foreign materials, such as glass chips or the like may not be generated during cutting. The cutting of a substrate using a laser may be achieved by thermal expansion and contraction of the substrate. Therefore, the glass chips which are generated due to mechanical friction or the like may not be generated.

Figure 6:
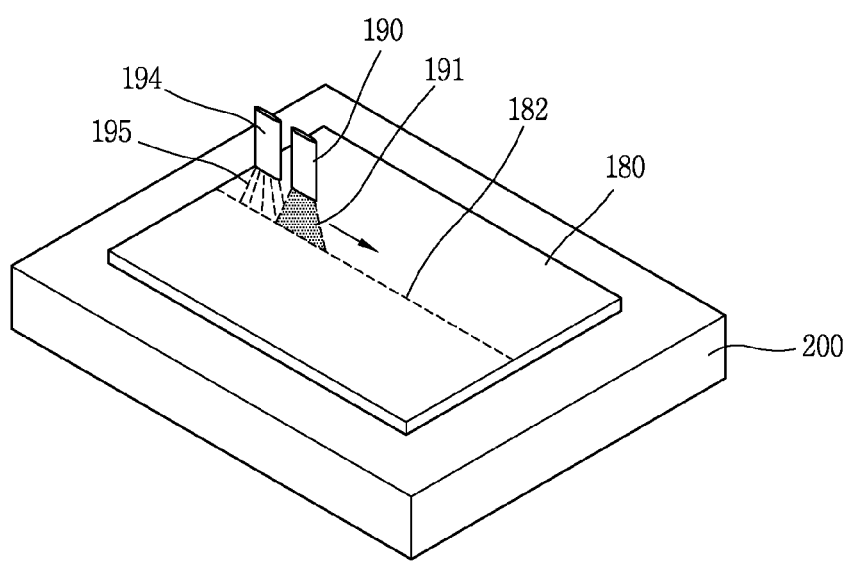
FIG. 6 is a view of cutting an OLED device in a unit of mother substrate by use of two lasers.

In the meantime, when the mother substrate is cut using two lasers, referring to FIG. 6, the two lasers 190 and 194 may be arranged in series or installed as one group to scan an OLED device in a unit of mother substrate, thereby cutting the OLED device.

That is, the two lasers 190 and 194 may irradiate first and second laser beams 191 and 195 continuously to the OLED device, to cut both the flexible substrate and the insulating layers and the glass substrate almost in real time, which may result in fast execution of the cutting process.

As described above, the present disclosure may allow materials with different properties to be cut off by two different cutting processes, thereby preventing the generation of a defective cut surface due to incomplete cutting. Specifically, after cutting the flexible substrate and the insulating layers of the OLED device using a laser, the glass mother substrate may be cut using a laser or a cutting wheel, which may prevent a crack from being propagated into a display part through the insulating layers, due to the incomplete cutting. This may result in preventing a fabrication of a defective display device due to an introduction of foreign materials or moisture.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method of cutting a flexible display device comprising:
    providing a mother substrate having a flexible substrate attached thereon and an insulating layer formed on the flexible substrate;
    melting the flexible substrate and the insulating layer on the mother substrate by irradiating with a first laser beam thereby exposing a portion of the mother substrate; and
    cutting the mother substrate along the portion exposed by the irradiation of the first laser beam using a second laser,
    wherein the first laser and the second laser are disposed adjacent to each other so that the first laser and the second laser are active simultaneously such that the first laser exposes the mother substrate, and the adjacent second laser cuts the mother substrate.

2. The method of claim 1, wherein the first laser comprises an AN-YAG laser.

3. The method of claim 1, wherein the second laser includes a CO2 laser.

4. The method of claim 1, wherein the second laser irradiates a laser beam onto the mother substrate a plurality of times.

5. The method of claim 1, wherein the flexible substrate is made of polyimide.

6. A method of fabricating an organic light emitting display (OLED) device comprising:
    providing a mother substrate having a plurality of panel regions;
    attaching a flexible substrate onto each panel region of the mother substrate, the flexible substrate having a display part and an outer part at the outside of the display part;
    forming an organic light emitting structure on the display part of the flexible substrate;
    melting the flexible substrate between the adjacent panel regions of the mother substrate by irradiating a laser beam thereto thereby exposing the portions of the mother substrate between the adjacent panel regions;
    cutting the mother substrate exposed by the irradiation of the first laser beam using a second laser, wherein the first laser and the second laser are disposed adjacent to each other so that the first laser and the second laser are active simultaneously such that the first layer exposes the mother substrate, and the adjacent second laser cuts the mother substrate; and
    separating the mother substrate from the flexible substrate.

7. The method of claim 6, wherein the forming of the organic light emitting structure comprises:
    forming a thin film transistor on each pixel;
    forming a first electrode on each pixel;
    forming an organic light emitting unit on the first electrode, the organic light emitting unit configured to emit light; and
    forming a second electrode on the organic light emitting unit.

8. The method of claim 6, wherein the flexible substrate is made of a plastic material.

9. The method of claim 6, wherein the separating of the mother substrate from the flexible substrate comprises irradiating with the first laser beam onto a rear surface of the mother substrate.

10. The method of claim 6, further comprising forming at least one passivation layer on the display part and the outer part of the panel region.

11. The method of claim 10, wherein the passivation layer is melted by the first laser beam.

12. The method of claim 1, wherein the mother substrate is made of glass.

* * * * *